United States Patent
Weber et al.

[11] Patent Number: 5,945,864
[45] Date of Patent: Aug. 31, 1999

[54] CIRCUIT CONFIGURATION FOR OFFSET COMPENSATION

[75] Inventors: Stephan Weber; Volker Thomas, both of München, Germany

[73] Assignee: Siemens Aktiengesellschaft, Munich, Germany

[21] Appl. No.: 08/892,184

[22] Filed: Jul. 14, 1997

[30] Foreign Application Priority Data

Jul. 12, 1996 [DE] Germany .......................... 196 28 257

[51] Int. Cl.⁶ ............................. H03L 5/00; H03B 1/00
[52] U.S. Cl. ........................ 327/307; 327/72; 327/558; 327/559
[58] Field of Search ..................... 327/307, 362, 327/354, 334, 104, 184, 558, 559, 72

[56] References Cited

U.S. PATENT DOCUMENTS

| 5,142,554 | 8/1992 | Stribling et al. | 327/72 |
| 5,264,804 | 11/1993 | Fox | 327/558 |
| 5,274,273 | 12/1993 | Baginski et al. | 327/72 |
| 5,306,968 | 4/1994 | Kimura | 307/494 |
| 5,307,196 | 4/1994 | Kinoshita | 327/72 |
| 5,392,317 | 2/1995 | Cho et al. | 327/558 |
| 5,488,449 | 1/1996 | Joo | 327/72 |

FOREIGN PATENT DOCUMENTS

3246176A1  6/1983  Germany .

OTHER PUBLICATIONS

"Linear Applications Handbook 1987", Linear Technology Corporation, Jim Williams, p. AN21–1.

*Primary Examiner*—Toan Tran
*Attorney, Agent, or Firm*—Herbert L. Lerner; Laurence A. Greenberg

[57] ABSTRACT

A circuit configuration for offset compensation includes a filter device for ascertaining a direct component in an input signal delivered to it and a linking device for subtractive linking of the input signal and an output signal of the filter device. A tracking and holding device which is connected between the filter device and the linking device is controllable by a control signal. The control signal is furnished by a window comparator device having an input to which the input signal is applied. When the input signal is within a predetermined window, the tracking and holding device is located in a tracking mode, while otherwise it is in a holding mode.

2 Claims, 1 Drawing Sheet

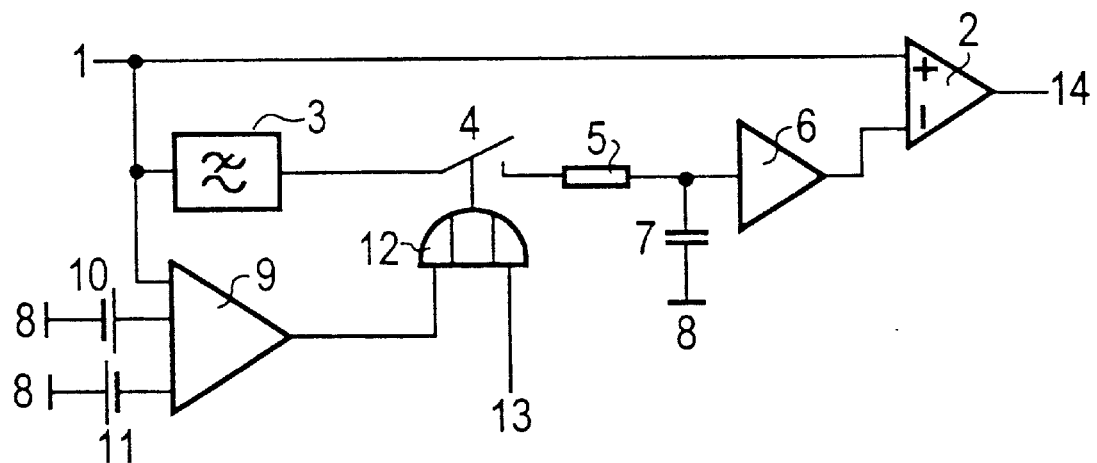

CIRCUIT CONFIGURATION FOR OFFSET COMPENSATION

BACKGROUND OF THE INVENTION

Field of the Invention

The invention relates to a circuit configuration for offset compensation, including a filter device for ascertaining a direct component in an input signal delivered to it and a linking device for subtractive linking of the input signal and an output signal of the filter device.

One such circuit configuration is known, for instance, from the corporate publication by Linear Technology Corporation, entitled: Linear Applications Handbook 1987, page AN21-1. In the circuit configuration described therein, on one hand the input signal is carried directly to an inverting input of an operational amplifier and on the other hand it is applied, with the interposition of a low-pass filter, to a noninverting input of the operational amplifier. The low-pass filter has a relatively low limit frequency, so that essentially only direct components reach the noninverting input of the operational amplifier. It is accordingly through the use of the low-pass filter that the direct current operating point adjustment of the operational amplifier is carried out, while the actual signal path extends through the inverting input.

However, when direct components are large it is problematic that the operational amplifier is overdriven in terms of direct current and accordingly requires a longer transient recovery time. In order to prevent that, in the known circuit configuration a voltage divider precedes the noninverting input of the operational amplifier. Often, however, it is necessary that the offset compensation function as precisely as possible up to the limit of the operating range of the operational amplifier and be sharply limited outside the operating range. Moving any farther away from that limit would only make the transient recovery time worse, and any nonlinearity near the range limit would lead to inaccuracies. Those demands, however, cannot be met with a voltage divider as in the known circuit configuration.

SUMMARY OF THE INVENTION

It is accordingly an object of the invention to provide a circuit configuration for offset compensation, which overcomes the hereinafore-mentioned disadvantages of the heretofore-known devices of this general type.

With the foregoing and other objects in view there is provided, in accordance with the invention, a circuit configuration for offset compensation, comprising a filter device for receiving an input signal, for ascertaining a direct component in the input signal and for supplying an output signal; a linking device for subtractive linking of the input signal and the output signal of the filter device; a tracking and holding device to be controlled by a control signal and to be operated in a tracking mode and a holding mode, the tracking and holding device connected between the filter device and the linking device; and a window comparator device having an input receiving the input signal and an output supplying the control signal; the tracking and holding device being in the tracking mode when the input signal is within a predetermined window and being otherwise in the holding mode.

In the circuit configuration of the invention, the gain in accuracy and the limitation of the maximum transient recovery time is attained at only slight additional expense for circuitry. Specifically, in a circuit configuration of this generic type a tracking and holding device that is controllable through the use of a control signal is connected between the filter device and the linking device, instead of using the voltage divider. The control signal is furnished by a window comparator device, having an input to which the input signal is applied. In the case where the input signal is located within a predetermined window, the tracking and holding device is in the tracking mode, and otherwise it is in the holding mode.

In accordance with a concomitant feature of the invention, the window corresponds to an operating range of other circuit elements.

Other features which are considered as characteristic for the invention are set forth in the appended claims.

Although the invention is illustrated and described herein as embodied in a circuit configuration for offset compensation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a schematic and block diagram of a circuit configuration for offset compensation according to the invention.

DESCRIPTION OF THE PREFERRED EMBODIMENTS

Referring now in detail to the single FIGURE of the drawing, there is seen an exemplary embodiment of a circuit configuration for offset compensation according to the invention, in which an input signal 1 having a direct component that varies continuously and very gradually, is delivered to a noninverting input of a comparator 2. The intent is to ascertain through the use of the comparator 2, whether the instantaneous amplitude of the alternating component is greater or less than 0, for example. A comparison signal to be applied to an inverting input of the comparator 2 should be dimensioned on the basis of the superimposed direct component in the input signal 1 in such a way that the direct component is compensated for.

A low-pass filter 3, to which the input signal 1 is delivered, is provided in order to provide for the compensation. A limit frequency of the low-pass filter 3 is selected to be so low that essentially only the direct components are allowed to pass through it. A tracking and holding device, which is connected downstream of the low-pass filter 3 in the exemplary embodiment, includes a controllable switch 4, a resistor 5 connected in series with the switch 4, a buffer amplifier 6 connected in series with the resistor, and a capacitor 7 that is connected on one hand to a node point between the resistor 5 and the buffer amplifier 5 and on the other hand to a reference potential 8. An output of the buffer amplifier 6, which forms an output of the tracking and holding device, is connected to the inverting input of the comparator 2.

The control of the switch 4 is effected primarily by a window comparator 9, having an input to which the input signal 1 is applied and having a window that is determined by two reference voltage sources 10 and 11, each connected between the window comparator and the reference potential 8. The voltages of the two reference voltage sources 10 and 11 are dimensioned in such a way that the window which they define corresponds to an operating range of other circuit elements, such as the comparator 2. Finally, an OR gate 12 which is also provided has one input that is connected to an output of the window comparator 9, another input to which an external control signal 13 is applied and an output at which a control signal for the controllable switch 4 is available. The external control signal 13 makes it possible to freeze the instantaneous value of the output signal of the low-pass filter 3, regardless of the window comparator 9.

In the exemplary embodiment, the range control of the comparator 2 is accordingly effected by a window comparator having an output which is linked to a control input of a tracking and holding device. As long as the direct component remains within the predetermined limits, the tracking and holding device functions in the tracking mode. In other words, the output signal of the low-pass filter 3 is switched essentially to the inverting input of the comparator 2. However, if the limits are exceeded, then a switchover to the holding mode is made, so that there is only a slight departure from the operating range of the comparator 2. An output signal 14 of the comparator 2 therefore has the same high accuracy over the entire operating range of the comparator. Moreover, after a departure from the operating range and a reentry into it, this high accuracy is regained quickly. This is due to the high linearity within the range limits and to the sharp limitation dictated by the tracking and holding device. The circuit configuration according to the invention can advantageously be used in the same way as a subtractive coupling/linking device in conjunction with amplifiers and other circuit elements as well, instead of the comparators shown. The circuit configuration according to the invention is distinguished by high accuracy and stability, especially in operation with low supply voltages.

We claim:

1. A circuit configuration for offset compensation, comprising:

a filter device for receiving an input signal, for ascertaining a direct component in the input signal and for supplying an output signal;

a comparator for subtractive comparing the input signal and the output signal of said filter device for generating a comparator output signal;

a tracking and holding device to be controlled by a control signal and to be operated in a tracking mode and a holding mode, said tracking and holding device connected between said filter device and said comparator; and a window comparator device having an input receiving the input signal and an output supplying the control signal;

said tracking and holding device being in the tracking mode when the input signal is within a predetermined window and being otherwise in the holding mode.

2. The circuit configuration according to claim 1, wherein said comparator has a given operating range, and the predetermined window corresponds to the given operating range.

* * * * *